(12) United States Patent
Endo

(10) Patent No.: US 6,614,245 B1
(45) Date of Patent: Sep. 2, 2003

(54) PROBE FOR BUMPS BETWEEN PRINTED WIRING BOARD AND CIRCUIT COMPONENT

(75) Inventor: Masashi Endo, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/161,829

(22) Filed: Sep. 29, 1998

(30) Foreign Application Priority Data

Apr. 28, 1998 (JP) .......................................... 10-118033

(51) Int. Cl.[7] .............................................. G01R 31/06
(52) U.S. Cl. ...................................... 324/754; 324/755
(58) Field of Search ................................ 324/754, 761, 324/72.5, 133, 755, 765; 439/482, 524, 669, 668, 66–70

(56) References Cited

U.S. PATENT DOCUMENTS

| | | | | |
|---|---|---|---|---|
| 4,894,612 A | * | 1/1990 | Drake et al. ............... | 324/72.5 |
| 5,184,065 A | * | 2/1993 | Chism ........................ | 324/72.5 |
| 5,387,872 A | * | 2/1995 | Nightingale ................ | 324/538 |
| 5,463,324 A | * | 10/1995 | Wardwell et al. ........... | 324/754 |
| 5,548,223 A | * | 8/1996 | Cole et al. .................. | 324/754 |
| 5,923,177 A | * | 7/1999 | Wardwell .................... | 324/754 |

OTHER PUBLICATIONS

Patent Abstracts of Japan No. 08271578, dated Oct. 18, 1996.

* cited by examiner

Primary Examiner—Vinh P. Nguyen
(74) Attorney, Agent, or Firm—Armstrong, Westerman, Hattori, LLP

(57) ABSTRACT

A probe includes a grip body attached with an electric terminal, and an arm body extending from the grip body. When the arm body has been inserted between a BGA and a printed wiring board, a contact electrode on the arm body is allowed to contact a target solder bump. An electric signal at the contact electrode is supplied via a wire to the electric terminal. Since the electric terminal is left outside the BGA, it is possible to easily connect a probe of an inspection apparatus such as an oscilloscope, a voltammeter and a logic analyzer to the electric terminal.

17 Claims, 6 Drawing Sheets

PROBE FOR BUMPS BETWEEN PRINTED WIRING BOARD AND CIRCUIT COMPONENT

BACKGROUND OF THE INVENTION

1. Field of the Invention

The present invention relates to a probe capable of picking up an electric signal from a circuit component such as a chip mounted on a printed wiring board.

2. Description of the Prior Art

Inspection of a circuit component such as a chip or a mounting device, in general, requires an inspection apparatus such as an oscilloscope, a voltammeter, a logic analyzer, and the like. Such an inspection apparatus is designed to analyze an electric signal in the circuit component for detecting the waveform and/or voltage and current values of the electric signal. A probe is employed to pick up the electric signal from the circuit component.

A probe comprises in general an insulated grip and a detect contact attached at the tip end of the insulated grip. If the detect contact comprises a clamp or hook member of metallic material, the detect contact can clamp or hook around a lead wire extending out from a circuit component. In this way, the tip end of the probe can be temporarily fixed at the lead wire. In addition, if the detect contact is formed into a metallic pipe embedded in the tip end of the probe, the detect contact can receive the insertion of a terminal pin provided on a circuit component. Thus, the tip end of the probe can be temporarily fixed at the terminal pin.

For example, a circuit component such as a ball grid array (BGA) comprises solder bumps. The solder bumps are arranged in a grid pattern on an underneath surface which is opposed to a printed surface of the printed wiring board. No lead wire or terminal pin is exposed out of the circuit component. Moreover, once the circuit component has been mounted on the printed wiring board, the solder bumps are hidden underneath the circuit component, so that the aforementioned probe cannot even reach the solder bumps.

Under the above circumstance, one inspection method is proposed to pick up an electric signal from wires printed on the surface of the printed wiring board around the circuit component, since the printed wires expand around the circuit component. However, this method requires identifying the circuit pattern on the printed wiring board prior to actual inspection. It is troublesome.

SUMMARY OF THE INVENTION

It is accordingly an object of the present invention to provide a probe capable of easily picking up an electric signal from a solder bump.

According to a first aspect of the present invention, there is provided a probe comprising: a grip body attached with an electric terminal; an arm body extending from the grip body; a contact electrode formed on the arm body at its side face; and a wire electrically connecting the contact electrode with the electric terminal.

The probe can be inserted between a printed wiring board and a circuit component which has been mounted on the printed wiring board, for example. When the arm body is slid along the surface of the printed wiring board underneath the circuit component, the contact electrode may contact a solder bump standing on the surface of the printed wiring board. The length of the arm body may serve to protrude the grip body of the probe from the outer periphery of the circuit component, so that it is possible to easily pick up an electric signal at the solder bump with the electric terminal formed on the grip body. An electric signal at the contact electrode is transmitted to the electric terminal via the wire.

The width of the arm body is preferably set smaller than an interval between solder bumps arranged on an underneath surface of a circuit component. Such width may contribute to a smooth insertion of the arm body between the solder bumps without any resistance from the solder bumps.

In addition, the length of the arm body is preferably set longer than a distance between an outer periphery of a circuit component and a solder bump arranged on an underneath surface of the circuit component. Such length may serve to leave the electric terminal on the grip body outside the outer periphery of the circuit component when the contact electrode reaches the target solder bump.

A protrusion may be formed on the arm body to extend in a direction opposite to a vertical vector imaginatively established on the surface of the contact electrode. Such protrusion may serve to position the contact electrode with respect to the target solder bump by contacting the solder bump opposed to the target solder bump.

According to a second aspect of the present invention, there is provided a probe comprising: a grip body attached with a plurality of electric terminals; an arm body extending from the grip body; a plurality of contact electrodes formed on the arm body at its side face; and a plurality of wires electrically connecting the respective contact electrodes with the corresponding electric terminals.

With the above probe, a plurality of contact electrodes formed on the arm body enable detection of electric signals at a plurality of solder bumps, for example, at the same time with the single arm body. In this case, the contact electrodes may be formed at a side surface of the arm body, or a pair of side surfaces of the arm body. In addition, a plurality of arm bodies may be formed for the single grip body.

In the above probe, an interval between the contact electrodes is preferably set at an interval between solder bumps arranged on a coupling surface of a circuit component. The set interval may serve to contact at least a pair of the contact electrodes with the corresponding pair of the solder bumps. The interval may be set dependent of the interval between the target solder bumps.

The arm body may comprise an insulation layer for isolating the respective wires. Employment of layered structure with the insulation layer may serve to incorporate a plurality of independent wires in a body of the probe without contact between the independent wires. Short can reliably be prevented. The layered structure can be obtained with a conventional layering technique.

Furthermore, according to a third aspect of the present invention, there is provided an inspection apparatus comprising: a main system capable of analyzing an electric signal; and a probe with a contact electrode formed on a side surface of an arm body extending from a grip body so as to supply the main system with an electric signal detected at the contact electrode.

The aforementioned probes according to the first and second aspects of the present invention may be connected to the main system. Accordingly, insertion of the arm body between a printed wiring board and a mounted circuit component enables easier detection of an electric signal at a solder bump arranged between the printed wiring board and the mounted circuit component. The probe may comprise a plurality of the contact electrodes. The main system may be any of an oscilloscope, a voltmeter, an ammeter, and a logic analyzer.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
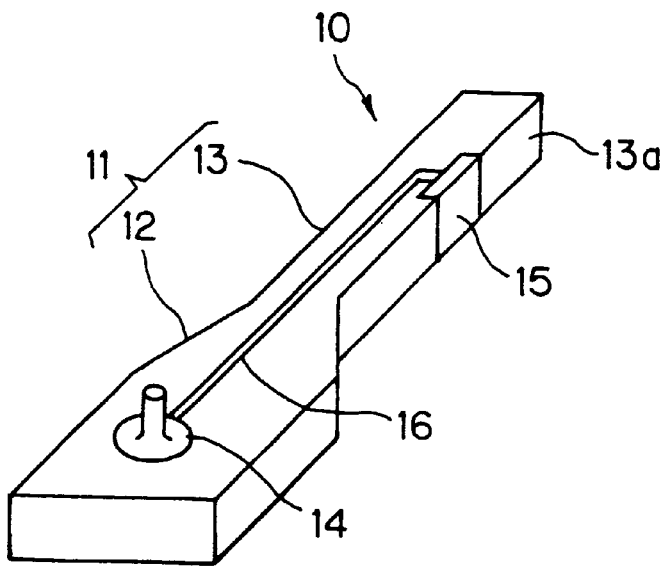
FIG. 1 is a perspective view illustrating the entire structure of a probe according to a first embodiment of the present invention.

FIG. 1 illustrates a probe 10 according to a first embodiment of the present invention. The probe 10 comprises an insulated body 11 which is comprised of a grip portion 12 and an arm portion 13 extending forward from the grip portion 12.

A terminal 14 is attached on the surface of the grip portion 12. The terminal 14 is formed into a pin-shaped electrode pad. A contact electrode 15 is attached on a side surface 13a of the arm portion 13. The contact electrode 15 is formed of a conductive rubber, and the like. The terminal 14 and the contact electrode 15 are electrically connected to each other through a printed wire 16 formed on the surface of the insulated body 11. The insulated body 11 of the probe 10 may be made from a polyimide resin having elasticity, for example.

Figure 2:
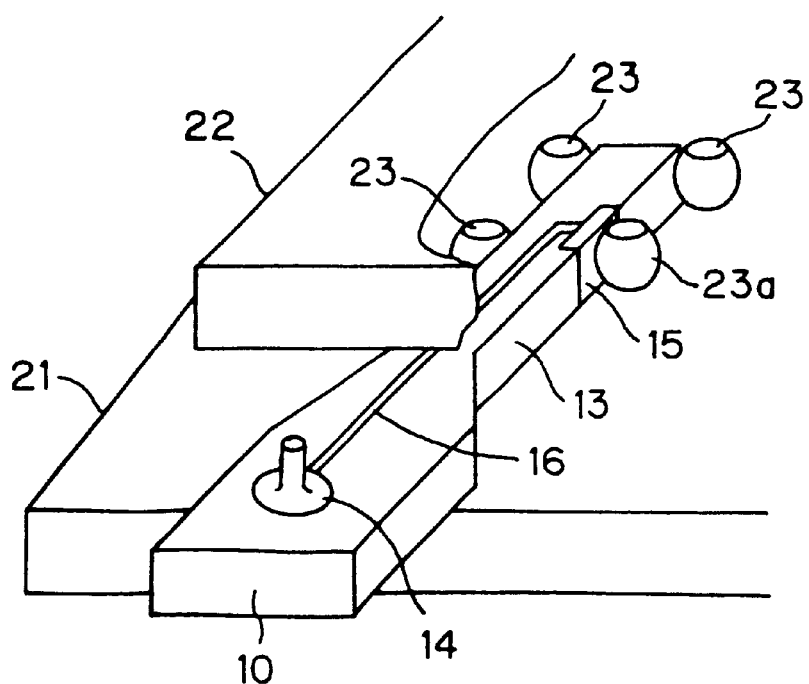
FIG. 2 is a perspective view illustrating the probe inserted between a printed wiring board and a BGA.

As is apparent from FIG. 2, the probe 10 can be inserted between a printed wiring board 21 and a circuit component 22 such as a BGA mounted on the printed wiring board 21. Electric conductivity or connection is established between the printed wiring board 21 and the circuit component 22 by a plurality of solder bumps 23, 23a arranged in a grid pattern on the underneath surface of the circuit component 22, namely, the surface opposed to the printed wiring board 21. When the probe 10 is slid along the surface of the printed wiring board 21, the arm portion 13 advances through gaps between the solder bumps 23, 23a. Therefore, the contact electrode 15 on the side surface 13a is allowed to contact the target solder bump 23a with some elasticity.

Figure 3:
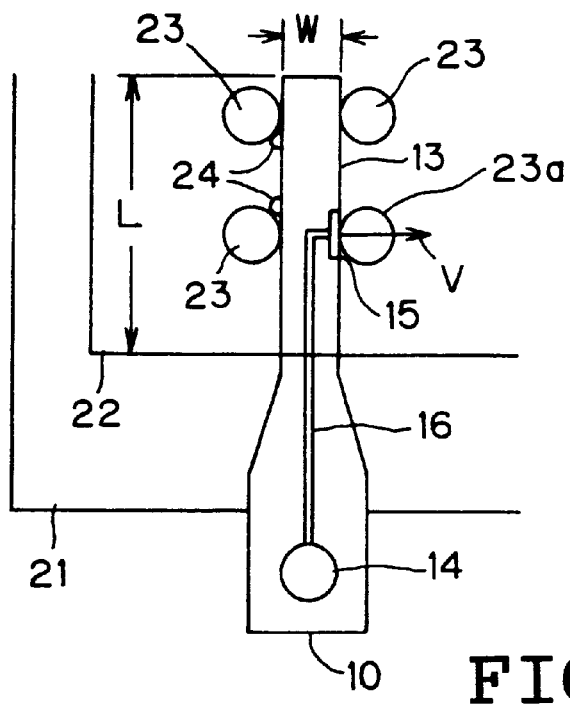
FIG. 3 is a plan view illustrating the probe inserted between a printed wiring board and a BGA.

As is apparent from FIG. 3, the width W of the arm portion 13 is preferably set smaller than a gap between the solder bumps 23, 23a arranged on the underneath surface of the circuit component 22. Such width W is supposed to contribute to a smooth insertion of the arm portion 13 between the solder bumps 23, 23a without receiving any resistance from the solder bumps 23, 23a. Even if the solder bumps 23, 23a are arranged off the precise grid pattern, the elasticity of the arm portion 13 serves to absorb such disorder.

In addition, the length L of the arm portion 13 is preferably set longer than a distance between the outer periphery 22a of the circuit component 22 and the target solder bump 23a. The length L may be set such that the terminal 14 is exposed out of the circuit component 22 when the contact electrode 15 contacts the target solder bump 23a.

As is apparent from FIGS. 1–3, the contact electrode is disposed at a flat side surface of the arm body and separates two insulated portions of the side surface along a longitudinal axis of the side surface.

Moreover, a protrusion 24 may be formed to extend in a direction opposite to a vertical vector V imaginatively established on the surface of the contact electrode 15, as shown in FIG. 3. The protrusion 24 may serve to position the contact electrode 15 with respect to the target solder bump 23a by contacting the opposed solder bump 23. In this case, the protrusion 24 preferably has a height insufficient to hinder insertion of the probe 10 between the solder bumps 23, 23a.

Figure 4:
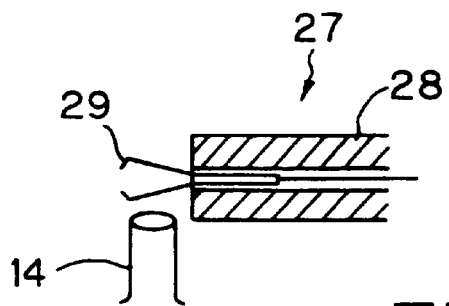
FIG. 4 illustrates an example of a probe of an inspection apparatus.

When the circuit component 22 is inspected, the terminal 14 of the probe 10 receives a probe 27 of an inspection apparatus such as an oscilloscope, a voltammeter, and the like. The probe 27 of the inspection apparatus comprises, for example, an insulated sheath 28 and a bifurcated detect contact 29 protruding from the tip end of the sheath 28, as shown in FIG. 4. When the sheath 28 advances relative to the bifurcated detect contact 29 after the bifurcated detect contact 29 is set to clamp the terminal 14, the bifurcated detect contact 29 is closed by the tightening force from the sheath 28, so that the probe 27 is temporarily fixed at the terminal 14.

Assume that a pair of the solder bumps 23 are selected for the circuit component 22 which has been mounted on the printed wiring board 21, and inspection for electric signal is effected to detect an operational characteristic of the circuit component 22. First, a pair of the probes 10 are inserted, underneath the outer periphery of the circuit component 22, and directed to corresponding target solder bumps 23a. After contact of the contact electrodes 15 with the target solder bumps 23a is confirmed, the probes 27 of the inspection apparatus are temporarily fixed to the corresponding terminals 14 of the respective probes 10.

When the circuit component 22 operates, an electric signal is transmitted from one target solder bump 23 to the other target solder bump 23. The electric signal is picked up with the probes 10 through the contact electrodes 15, the printed wires 16, and the terminals 14. The inspection apparatus then receives the electric signal, so that it can analyze the received electric signal for detecting the waveform and/or voltage and current values of the electric signal.

Figure 5:
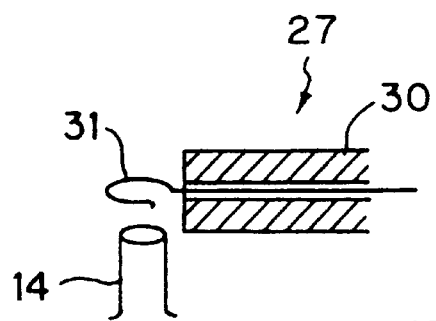
FIG. 5 illustrates another example of a probe of an inspection apparatus.
Figure 6:
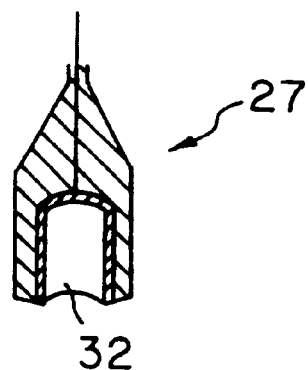
FIG. 6 illustrates a further example of a probe of an inspection apparatus.
Figure 6:

FIGS. 5 and 6 illustrates other types of the probe 27 applicable to connection with the aforementioned terminal 14 of a pin-shaped electrode pad. A probe 27 in FIG. 5 comprises an insulated sheath 30 and a hook-shaped detect contact 31 protruding at the tip end of the sheath 30. The detect contact 31 is hooked around the terminal 14 for a temporary fixation. A probe 27 in FIG. 6 comprises a detect contact 32 formed into a metallic pipe embedded in the tip end of the probe 27. When the detect contact 32 receives insertion of the terminal 14, the probe 27 can be temporarily fixed on the terminal 14.

It should be noted that the aforementioned probes 10 may be employed, not only in inspection as described above, but also in repair of the wiring and for subsidiary wiring. In the latter cases, electric conductivity or connection may be established between the terminals 14 of the probes 10 inserted from the periphery of the circuit component 22.

Figure 7:
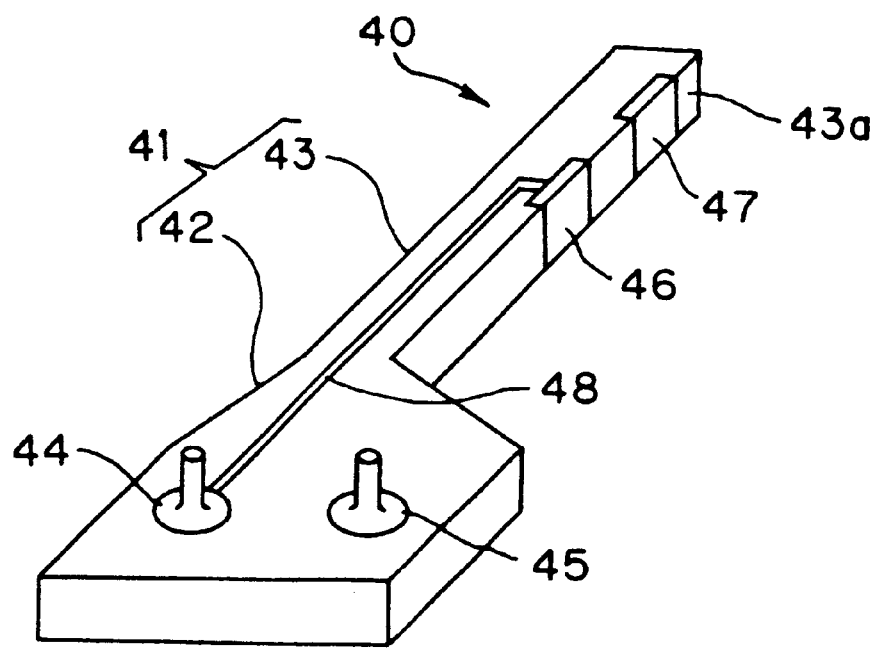
FIG. 7 is a perspective view illustrating the entire structure of a probe according to a second embodiment of the present invention.

FIG. 7 illustrates a probe 40 according to a second embodiment of the present invention. The probe 40 comprises an insulated body 41 which is comprised of a grip portion 42 and an arm portion 43 extending forward from the grip portion 42. First and second terminals 44, 45 are independently attached on the surface of the grip portion 42. Each of the first and second terminals 44, 45 is formed into a pin-shaped electrode pad. First and second contact electrodes 46, 47 are independently attached on a side surface 43a of the arm portion 43. Both first and second contact electrodes 46, 47 are formed of a conductive rubber, and the like. The first terminal 44 and the first contact electrode 46 are electrically connected to each other by a printed wire 48 formed on the surface of the insulated body 41.

Figure 8:
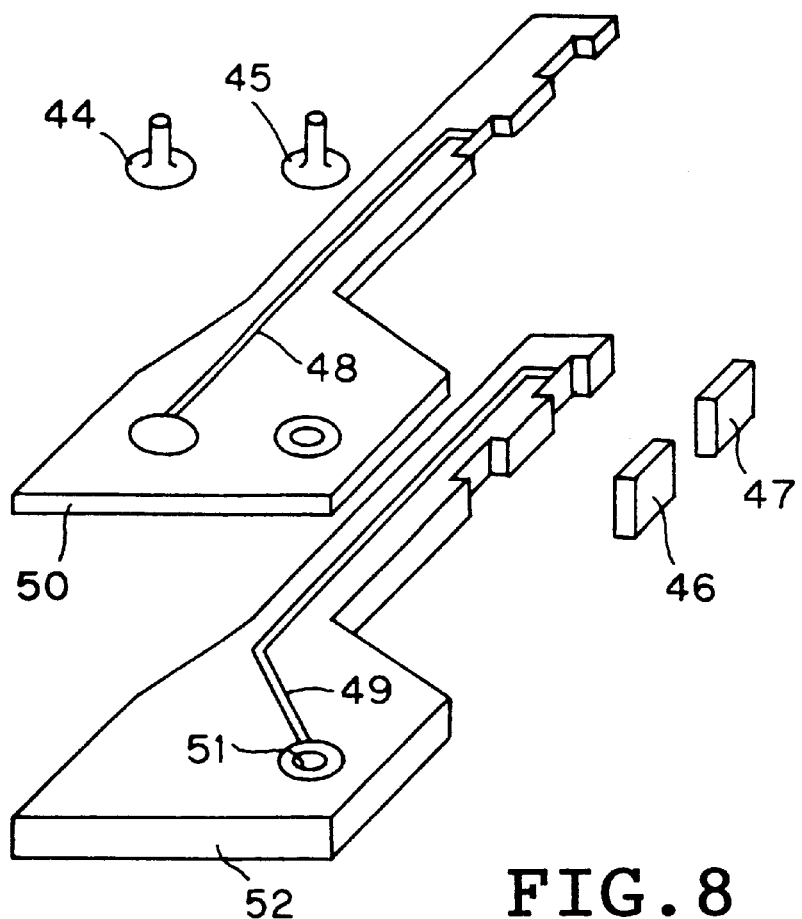
FIG. 8 is an exploded view illustrating the probe.

As is apparent from FIG. 8, the second terminal 45 and the second contact electrode 47 are electrically connected to each other by a printed wire 49 formed in the insulated body 41. The printed wires 48, 49 are isolated from each other by an insulation layer 50. The printed wire 49 is electrically connected to the second terminal 45 by a via hole 51 formed in the insulated body 41.

Figure 9:
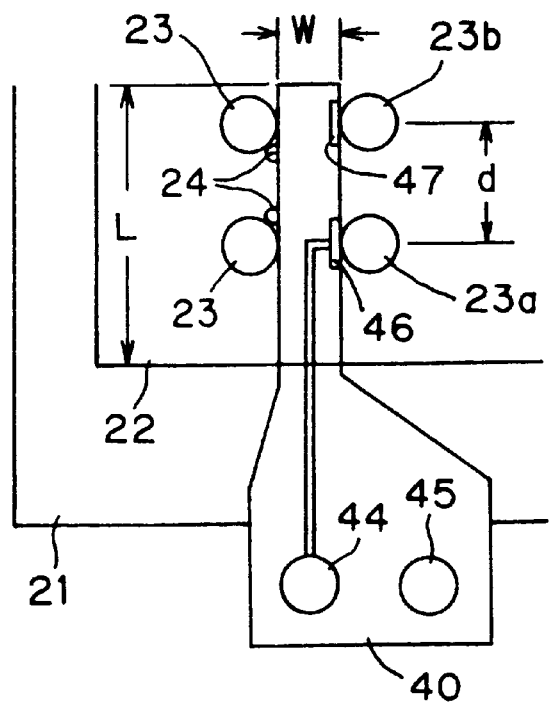
FIG. 9 is a plan view illustrating the probe inserted between a printed wiring board and a BGA.

As is apparent from FIGS. 7–9, each of the contact electrodes is disposed at a flat side surface of the arm body and separates two insulated portions of the side surface along a longitudinal axis of the side surface.

The description will next be made on production method of the probe 40 referring to FIG. 8. First, a base body 52 of the insulated body 41 is formed from a polyimide resin and the like. The printed wire 49 is then formed on the surface of the base body 52. Thereafter, the insulation layer 50 is formed all over the surface of the base body 52 from a polyimide resin and the like. The printed wire 48 is then formed on the surface of the insulation layer 50.

The via hole 51 is then formed to penetrate through the insulation layer 50 and the base body 52 in the grip portion 42. The via hole 51 is connected to the base end of the printed wire 49 formed on the surface of the base body 52. The second terminal 45 is then attached to the via hole 51 at the surface of the insulation layer 50. The first terminal 44 is attached to the base end of the printed wire 48 on the surface of the insulation layer 50.

The first and second contact electrodes 46, 47 are attached to the arm portion 43. Attachment may be effected by an adhesive and the like, for example. The first contact electrode 46 is connected to the tip end of the printed wire 48 formed on the surface of the insulation layer 50. The second contact electrode 47 is connected to the tip end of the printed wire 49 on the surface of the base body 52.

The probe 40 can be inserted between a printed wiring board 21 and a circuit component 22 which has been mounted on the printed wiring board 21 in the same manner as of the aforementioned probe 10 (see FIG. 2). As is apparent from FIG. 9, when the probe 40 is slid along the surface of the printed wiring board 21, the arm portion 43 advances through gaps between the solder bumps 23, 23a, 23b. Therefore, the first and second contact electrodes 46, 47 on the side surface of the arm portion 43 are allowed to contact the target solder bumps 23a, 23b with some elasticity.

The width w and the length L of the probe 40 can be set in the same manner as described above. However, this probe 40 has an interval d, between the first and second contact electrodes 46, 47, set almost equal to the interval between the solder bumps 23a, 23b arranged on the underneath surface of the circuit component 22. As a result, when the probe 40 is inserted, an electric signal at the solder bump 23a can be picked up with the first contact electrode 46, the printed wire 48 and the terminal 44, while an electric signal at the solder bump 23b can be picked up with the second contact electrode 47, the printed wire 49 and the terminal 45. Accordingly, the electric signal can be picked up at two solder bumps 23a, 23b with a single probe 40.

Figure 10:
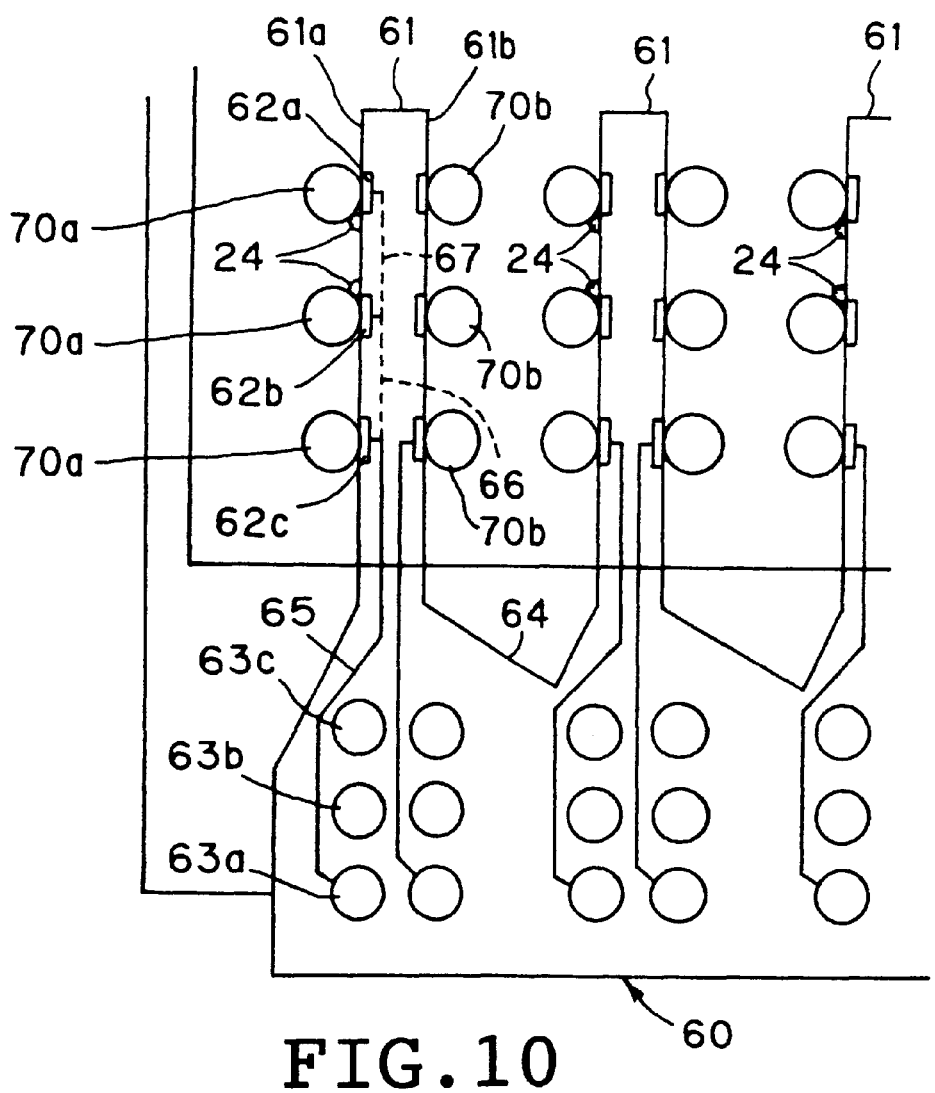
FIG. 10 is a plan view illustrating another example of the probe inserted between a printed wiring board and a BGA.

Although the aforementioned probe 40 comprises a pair of contact electrodes 46, 47 at the identical surface of the arm portion 43, a probe 60 may comprise three or more contact electrodes 62a, 62b, 62c at a side surface 61a of an arm portion 61, as shown in FIG. 10.

In this case, three terminals 63a, 63b, 63c are attached to the surface of a grip portion 64 so as to respectively correspond to the contact electrodes 62a, 62b, 62c. For example, the contact electrode 62a and the corresponding terminal 63a are electrically connected to each other by a printed wire 65 formed on the surface of an insulated body of the probe 60. The contact electrode 62b and the corresponding terminal 63b are electrically connected to each other by a printed wire 66, while the contact electrode 62c and the corresponding terminal 63c are electrically connected to each other by a printed wire 67. The printed wires 65, 66, 67 are insulated to each other by insulation layers forming the insulated body of the probe 60. Specifically, the number of insulation layers is supposed to depend upon the number of printed wires.

Furthermore, contact electrodes may be formed on not only a single surface of the arm portion, but also two surfaces 61a, 61b of the single arm portion 61. This arrangement serves to simultaneously pick up electric signals from two rows of solder bumps 70a, 70b with the single arm portion 61.

Figure 11:
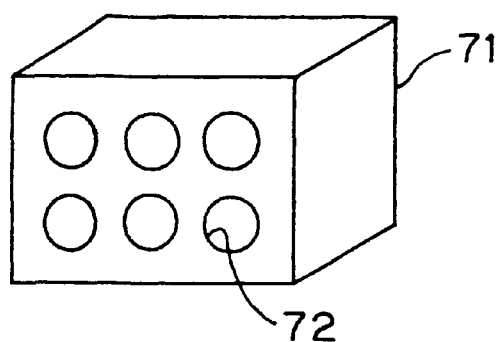
FIG. 11 is a perspective view illustrating a connector probe for a logic analyzer.

Furthermore, the single grip portion 64 may have a plurality of arm portions 61. In this case, arrangement of the terminals 63a, 63b, 63c in a grid pattern enables application of a connector probe 71 for a logic analyzer, for example, as shown in FIG. 11. As is apparent from FIG. 11, the connector probe 71 may comprise a plurality of metallic pipes 72 embedded in the tip end of the probe in a grid pattern, for example. The probe 71 may contribute to inspection of electric signals in multiple combinations without changing the position of the probe 71.

It should be noted that the identical reference numerals are attached to the structure achieving the same effect or function as of the above first embodiment, and detailed description is omitted in this second embodiment.

Figure 12:
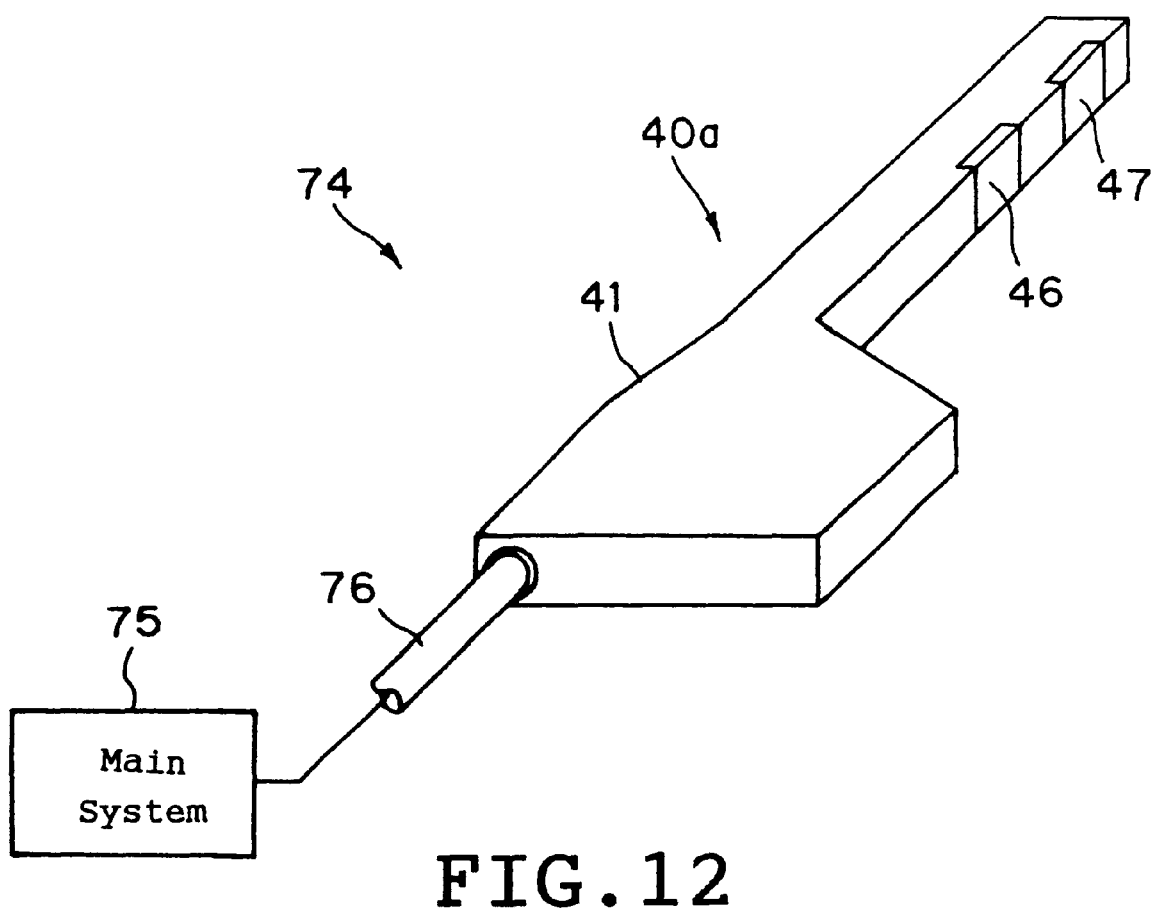
FIG. 12 is a perspective view illustrating an example of an inspection apparatus according to the present invention.

FIG. 12 illustrates an entire structure of an inspection apparatus 74 according to the present invention. The inspection apparatus 74 comprises a probe 40a for picking up an electric signal of a component to be inspected with the contact electrodes 46, 47, and a main system 75 for analyzing the supplied electric signal. The probe 40a has the structure almost same as the probe 40 in FIG. 7. However, the probe 40a has a line 76 leading to the main system 75 for transmitting an electric signal from the contact electrodes 46, 47, in place of the terminals 44, 45 formed on the surface of the grip portion 42 of the probe 40 in FIG. 7. In addition, the printed wire 48 is not exposed outside and is incorporated in the insulated body 41 of the probe 40a. The above-described method for forming the insulation layer 50 can be employed to incorporate the printed wire 48 in the insulated body 41.

The main system 75 can be any of an oscilloscope, a voltammeter, a logic analyzer, and the like. And also, the aforementioned probes 10, 60 in FIGS. 1 and 10 can be employed in place of the probe 40*a*. Further, transmission of an electric signal between the main system 75 and the probe 40*a* may be effected by a radio communication, an infrared communication or the like, in place of the line communication.

It should be noted that the identical reference numerals are attached to the structure achieving the same effect or function as of the above first and second embodiments, and detailed description is omitted.

What is claimed is:

1. A probe for testing a circuit component mounted on a printed circuit board, said circuit component having bumps arranged on an underneath surface of said circuit component, said underneath surface facing the printed circuit board, comprising:
    a grip body attached with at least an electric terminal; an insulated arm body extending from the grip body and adapted to slide between the bumps;
    at least a contact electrode disposed at a flat side surface of the arm body and separating two insulated portions of the side surface along a longitudinal axis of the side surface for contacting at least one of the bumps; and
    a wire electrically connecting the contact electrode with the electric terminal.

2. The probe according to claim 1, wherein width of said arm body is set smaller than an interval between the bumps.

3. The probe according to claim 1, wherein length of said arm body is set longer than a distance between an outer periphery of the circuit component and at least one of the bumps.

4. The probe according to claim 1, wherein the grip body is attached with a plurality of the electric terminals, and a plurality of the contact electrodes are formed on the arm body at the side face, the respective contact electrodes being electrically connected with the corresponding electrical terminals through a plurality of wires.

5. The probe according to claim 4, wherein an interval between said contact electrodes is correspondingly set at an interval between bumps arranged on an underneath surface of a circuit component.

6. The probe according to claim 4, wherein said arm body comprises an insulation layer for isolating the respective wires.

7. The probe according to claim 1, wherein said contact electrode is expected to contact at least one of the bumps between the circuit component and the printed circuit board.

8. A method of inspecting a circuit component, comprising:
    removably inserting a probe according to claim 1 by sliding the probe between the circuit component and a printed wiring board on which the circuit component is mounted through a bump; and
    establishing an electric connection between the bump and a contact electrode formed on the probe without twisting the probe.

9. The probe according to claim 1, wherein said arm body includes a bottom flat surface received on an upper surface of the printed circuit board for sliding movement of the arm body, said contact electrode having an exposed surface extending along a plane perpendicular to a plane including the flat bottom surface.

10. A probe for testing a circuit component mounted on a printed circuit board, said circuit component having bumps arranged on an underneath surface of said circuit component, said underneath surface facing the printed circuit board, comprising:
    a grip body attached with at least an electric terminal;
    an insulated arm body extending from the grip body and adapted to slide between the bumps;
    at least a contact electrode exposed at a flat side surface of the arm body for contacting at least one of the bumps;
    a wire electrically connecting the contact electrode with the electric terminal; and
    a protrusion formed on the arm body to extend in a direction opposite to a vertical vector imaginatively established on a surface of the contact electrode.

11. An inspection apparatus for testing a circuit component mounted on a printed circuit board, said circuit component having bumps arranged on an underneath surface of the circuit component, said underneath surface facing the printed circuit board, comprising:
    a main system designed to analyze an electric signal; and
    a probe with an insulated arm body extending from a grip body, said arm body being adapted to slide between said bumps, a contact electrode being disposed at a flat side surface of the arm body and separating two insulated portions of the side surface along a longitudinal axis of the side surface for contacting at least one of the bumps, so as to supply the main system with an electric signal detected at the contact electrode.

12. The inspection apparatus according to claim 11, wherein said probe comprises a plurality of said contact electrodes.

13. The inspection apparatus according to claim 11, wherein said main system is any of an oscilloscope, a voltmeter, an ammeter, and a logic analyzer.

14. The inspection apparatus according to claim 11, wherein said contact electrode is expected to contact at least one of the bumps between the circuit component and the printed circuit board.

15. The inspection apparatus according to claim 11, wherein said arm body includes a bottom flat surface received on an upper surface of the printed circuit board for sliding movement of the arm body, said contact electrode having an exposed surface extending along a plane perpendicular to a plane including the flat bottom surface.

16. A probe for testing a circuit component mounted on a printed circuit board, said circuit component having bumps arranged on an underneath surface of said circuit component, said underneath surface facing the printed circuit board, comprising:
    a grip body attached with at least an electric terminal;
    an insulated arm body extending from the grip body and adapted to slide between the bumps;
    at least a contact electrode exposed at a flat side surface of the arm body for contacting at least one of the bumps; and
    a wire electrically connecting the contact electrode with the electric terminal, wherein
    said electric terminal comprises a pin-shaped electrode pad fixed on an upper surface of the grip body.

17. An inspection apparatus for testing a circuit component mounted on a printed circuit board, said circuit component having bumps arranged on an underneath surface of said circuit component, said underneath surface facing the printed circuit board, comprising:

a main system designed to analyze an electric signal; and a probe, wherein the probe comprises:

a grip body attached with an electric terminal;

an insulated arm body extending from the grip body, said arm body being adapted to slide between said bumps; and a contact electrode disposed at a flat side surface of said arm body for contacting at least one of the bumps, so as to supply the main system with an electric signal detected at the contact electrode, wherein said electric terminal comprises a pin-shaped electrode pad fixed on an upper surface of the grip body.

* * * * *